(12) United States Patent
Gellineau et al.

(10) Patent No.: US 12,019,030 B2
(45) Date of Patent: Jun. 25, 2024

(54) METHODS AND SYSTEMS FOR TARGETED MONITORING OF SEMICONDUCTOR MEASUREMENT QUALITY

(71) Applicant: KLA Corporation, Milpitas, CA (US)

(72) Inventors: Antonio Arion Gellineau, Santa Clara, CA (US); Andrei V. Shchegrov, Los Gatos, CA (US); Hyowon Park, Milpitas, CA (US); Pavan Gurudath, Ann Arbor, MI (US); Christopher Liman, Milpitas, CA (US); Jung Heon Song, Ann Arbor, MI (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/578,310

(22) Filed: Jan. 18, 2022

(65) Prior Publication Data
US 2023/0228692 A1    Jul. 20, 2023

(51) Int. Cl.
*G01N 21/95* (2006.01)
*G01N 21/88* (2006.01)

(52) U.S. Cl.
CPC . *G01N 21/9501* (2013.01); *G01N 2021/8845* (2013.01); *G01N 2021/8848* (2013.01); *G01N 2021/8883* (2013.01)

(58) Field of Classification Search
CPC ....... G01N 21/9501; G01N 2021/8845; G01N 2021/8848; G01N 2021/8883
(Continued)

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

WO    2021001114 A1    1/2021

OTHER PUBLICATIONS

Lemaillet, Germer, Kline et al., "Intercomparison between optical and x-ray scatterometry measurements of FinFET structures" by Proc. SPIE, v.8681, p. 86810Q (2013).
(Continued)

*Primary Examiner* — Tri T Ton
(74) *Attorney, Agent, or Firm* — Spano Law Group; Joseph S. Spano

(57) ABSTRACT

Methods and systems for monitoring the quality of a semiconductor measurement in a targeted manner are presented herein. Rather than relying on one or more general indices to determine overall measurement quality, one or more targeted measurement quality indicators are determined. Each targeted measurement quality indicator provides insight into whether a specific operational issue is adversely affecting measurement quality. In this manner, the one or more targeted measurement quality indicators not only highlight deficient measurements, but also provide insight into specific operational issues contributing to measurement deficiency. In some embodiments, values of one or more targeted measurement quality indicators are determined based on features extracted from measurement data. In some embodiments, values of one or more targeted measurement quality indicators are determined based on features extracted from one or more indications of a comparison between measurement data and corresponding measurement data simulated by a trained measurement model.

19 Claims, 9 Drawing Sheets

(58) Field of Classification Search
USPC .................. 356/237.1–237.6, 239.1–239.8
See application file for complete search history.

(56) References Cited

U.S. PATENT DOCUMENTS

| | | | |
|---|---|---|---|
| 6,023,338 | A | 2/2000 | Bareket |
| 6,429,943 | B1 | 8/2002 | Opsal et al. |
| 6,716,646 | B1 | 4/2004 | Wright et al. |
| 6,778,275 | B2 | 8/2004 | Bowes |
| 6,787,773 | B1 | 9/2004 | Lee |
| 6,992,764 | B1 | 1/2006 | Yang et al. |
| 7,242,477 | B2 * | 7/2007 | Mieher ............. G03F 9/7049 356/401 |
| 7,321,426 | B1 | 1/2008 | Poslavsky et al. |
| 7,406,153 | B2 | 7/2008 | Berman |
| 7,478,019 | B2 * | 1/2009 | Zangooie ......... G01B 11/0625 703/2 |
| 7,626,702 | B2 | 12/2009 | Ausschnitt et al. |
| 7,656,528 | B2 | 2/2010 | Abdulhalim et al. |
| 7,826,071 | B2 | 11/2010 | Shchegrov et al. |
| 7,842,933 | B2 | 11/2010 | Shur et al. |
| 7,873,585 | B2 | 1/2011 | Izikson |
| 7,929,667 | B1 | 4/2011 | Zhuang et al. |
| 7,933,026 | B2 | 4/2011 | Opsal et al. |
| 8,068,662 | B2 | 11/2011 | Zhang et al. |
| 8,138,498 | B2 | 3/2012 | Ghinovker |
| 9,291,554 | B2 | 3/2016 | Kuznetsov et al. |
| 9,826,614 | B1 | 11/2017 | Bakeman et al. |
| 9,885,962 | B2 | 2/2018 | Veldman et al. |
| 9,915,522 | B1 | 3/2018 | Jiang et al. |
| 10,013,518 | B2 | 7/2018 | Bakeman et al. |
| 10,101,670 | B2 | 10/2018 | Pandev et al. |
| 10,152,678 | B2 | 12/2018 | Pandev et al. |
| 10,324,050 | B2 | 6/2019 | Hench et al. |
| 10,325,004 | B1 | 6/2019 | Dziura et al. |
| 10,352,695 | B2 | 7/2019 | Dziura et al. |
| 10,504,006 | B2 | 12/2019 | Bhaviripudi et al. |
| 2003/0021465 | A1 | 1/2003 | Adel et al. |
| 2007/0176128 | A1 | 8/2007 | Van Bilsen et al. |
| 2007/0221842 | A1 | 9/2007 | Morokuma et al. |
| 2009/0152463 | A1 | 6/2009 | Toyoda et al. |
| 2011/0266440 | A1 | 11/2011 | Boughorbel et al. |
| 2012/0292502 | A1 | 11/2012 | Langer et al. |
| 2013/0208279 | A1 | 8/2013 | Smith |
| 2013/0304424 | A1 | 11/2013 | Bakeman et al. |
| 2014/0019097 | A1 | 1/2014 | Bakeman et al. |
| 2014/0064445 | A1 | 3/2014 | Adler |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0297211 | A1 | 10/2014 | Pandev et al. |
| 2015/0046121 | A1 | 2/2015 | Dziura et al. |
| 2015/0110249 | A1 | 4/2015 | Bakeman et al. |
| 2015/0117610 | A1 | 4/2015 | Veldman et al. |
| 2015/0204664 | A1 | 7/2015 | Bringoltz et al. |
| 2015/0285749 | A1 | 10/2015 | Moncton et al. |
| 2015/0300965 | A1 | 10/2015 | Sezginer et al. |
| 2016/0154319 | A1 | 6/2016 | Mossavat et al. |
| 2016/0202193 | A1 | 7/2016 | Hench et al. |
| 2016/0320319 | A1 | 11/2016 | Hench et al. |
| 2017/0167862 | A1 | 6/2017 | Dziura et al. |
| 2018/0106735 | A1 | 4/2018 | Gellineau et al. |
| 2018/0113084 | A1 | 4/2018 | Hench et al. |
| 2018/0328868 | A1 | 11/2018 | Bykanov et al. |
| 2019/0017946 | A1 | 1/2019 | Wack et al. |
| 2019/0293578 | A1 | 9/2019 | Gellineau |
| 2020/0200525 | A1 | 6/2020 | Chouaib et al. |
| 2021/0207956 | A1 | 7/2021 | Shchegrov et al. |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).
International Search Report mailed on Apr. 27, 2023, for PCT Application No. PCT/US2022/053898 filed on Dec. 22, 2022 by KLA Corporation, 3 pages.

\* cited by examiner

METHODS AND SYSTEMS FOR TARGETED MONITORING OF SEMICONDUCTOR MEASUREMENT QUALITY

TECHNICAL FIELD

The described embodiments relate to measurement systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and X-ray based metrology techniques offer the potential for high throughput without the risk of sample destruction. A number of metrology based techniques including scatterometry, reflectometry, and ellipsometry implementations and associated analysis algorithms are commonly used to characterize critical dimensions, film thicknesses, composition, overlay and other parameters of nanoscale structures.

Many metrology techniques are indirect methods of measuring physical properties of a specimen under measurement. In most cases, the raw measurement signals cannot be used to directly determine the physical properties of the specimen. Instead, a measurement model is employed to estimate the values of one or more parameters of interest based on the raw measurement signals. For example, ellipsometry is an indirect method of measuring physical properties of the specimen under measurement. In general, a physics-based measurement model or a machine learning based measurement model is required to determine the physical properties of the specimen based on the raw measurement signals (e.g., $\alpha_{meas}$ and $\beta_{meas}$).

In some examples, a physics-based measurement model is created that attempts to predict the raw measurement signals (e.g., $\alpha_{meas}$ and $\beta_{meas}$) based on assumed values of one or more model parameters. As illustrated in equations (1) and (2), the measurement model includes parameters associated with the metrology tool itself, e.g., system parameters ($P_{system}$), and parameters associated with the specimen under measurement. When solving for parameters of interest, some specimen parameters are treated as fixed valued ($P_{spec-fixed}$) and other specimen parameters of interest are floated ($P_{spec-float}$), i.e., resolved based on the raw measurement signals.

$$\alpha_{model} = f(P_{system}, P_{spec-fixed}, P_{spec-float}) \quad (1)$$

$$\beta_{model} = f(P_{system}, P_{spec-fixed}, P_{spec-float}) \quad (2)$$

System parameters are parameters used to characterize the metrology tool (e.g., ellipsometer 101). Exemplary system parameters include angle of incidence (AOI), analyzer angle ($A_0$), polarizer angle ($P_0$), illumination wavelength, numerical aperture (NA), compensator or waveplate (if present), etc. Specimen parameters are parameters used to characterize the specimen (e.g., material and geometric parameters characterizing the structure(s) under measurement). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the system parameters and many of the specimen parameters are treated as known, fixed valued parameters. However, the values of one or more of the specimen parameters are treated as unknown, floating parameters of interest.

In some examples, the values of the floating parameters of interest are resolved by an iterative process (e.g., regression) that produces the best fit between theoretical predictions and experimental data. The values of the unknown, floating parameters of interest are varied and the model output values (e.g., $\alpha_{model}$ and $\beta_{model}$) are calculated and compared to the raw measurement data in an iterative manner until a set of specimen parameter values are determined that results in a sufficiently close match between the model output values and the experimentally measured values (e.g., $\alpha_{meas}$ and $\beta_{meas}$). In some other examples, the floating parameters are resolved by a search through a library of pre-computed solutions to find the closest match.

In some other examples, a trained machine learning based measurement model is employed to directly estimate values of parameters of interest based on raw measurement data. In these examples, a machine learning based measurement model takes raw measurement signals as model input and generates values of the parameters of interest as model output.

Both physics based measurement models and machine learning based measurement models must be trained to generate useful estimates of parameters of interest for a particular measurement application. Generally, model training is based on raw measurement signals collected from specimen having known values of the parameters of interest (i.e., Design of Experiments (DOE) data).

A machine learning based measurement model is parameterized by a number of weight parameters. Traditionally, the machine learning based measurement model is trained by a regression process (e.g., ordinary least squares regression). The values of the weight parameters are iteratively adjusted to minimize the differences between the known, reference values of the parameters of interest and values of the parameters of interest estimated by the machine learning based measurement model based on the measured raw measurement signals.

As described hereinbefore, a physics based measurement model is parameterized by a number of system parameters and specimen parameters. Traditionally, a physics based measurement model is also trained by a regression process (e.g., ordinary least squares regression). One or more of the system parameters and specimen parameters are iteratively adjusted to minimize the differences between the raw measurement data and the modelled measurement data. For each iteration, the values of the particular specimen parameters of interest are maintained at the known DOE values.

Both trained machine learning based measurement models and physics based models estimate values of parameters of interest based on measurement data. The accuracy of the estimation depends on measurement data. For example, measurement data outside the domain of the measurement data observed during the model training phase may give rise to large prediction errors due to extrapolation.

Traditionally, several techniques have been explored to quantify measurement uncertainty associated with each measurement site. Several standard quality metrics exist. Some exemplary measurement quality metrics are not specific to a particular measurement parameter. In these examples, the quality of a measurement is determined based on fitting quality. Typical quantitative metrics employed to characterize quality of fit include chi squared, goodness of fit, etc.

In these examples, simulated or expected signals (S) are compared to the actual measurement signal (M) by a suitable norm. In some examples the differences are weighted by uncertainty thresholds (w). For more complex systems the differences are weighted after a mathematical transformation of the simulated and measured signals (e.g., transform photon signals into an independent vector of principle components). In these cases, fitting quality can be expressed by equation (3), where N is the number of signals.

$$\Sigma_{i=1}^{N} w_i |S_i - M_i|^2 \qquad (3)$$

In general, equation (3) can be modified by any normalization. Alternatively, quality can be expressed as a function based on equation (3).

Other measurement quality metrics are specific to one or more measurement parameters, e.g., projected model uncertainty. In one example, a noise model multiplied by a sensitivity function provides an estimate of measurement uncertainty associated with a particular parameter or group of parameters.

Different measurement applications have different amounts of signals (N), different thresholds with respect to each use case, and different issues that specifically affect quality. Unfortunately, the traditional approaches to assessment of measurement quality struggle to capture the specific issues affecting measurement quality, particularly over a broad range of measurement applications.

Future metrology applications present challenges for metrology due to increasingly small resolution requirements, multi-parameter correlation, increasingly complex geometric structures, and increasing use of opaque materials. Thus, methods and systems for improved assessment of measurement quality are desired.

SUMMARY

Methods and systems for monitoring the quality of a semiconductor measurement in a targeted manner are presented herein. Rather than relying on one or more general indices to determine overall measurement quality, one or more targeted measurement quality indicators are determined. Each targeted measurement quality indicator provides insight into whether a specific operational issue is adversely affecting measurement quality. In this manner, the one or more targeted measurement quality indicators not only highlight deficient measurements, but also provide insight into specific operational issues contributing to measurement deficiency.

In some embodiments, a value of a targeted measurement quality indicator is determined for each measurement sample during measurement inference. In some of these embodiments, a semiconductor measurement involves inferring values of one or more parameters of interest from measurement data using a trained measurement model. If the estimated value of the targeted measurement quality indicator indicates that measurement quality is insufficient, the measurement is flagged. In some examples, repeated instances of insufficient measurement quality indicate that the measurement model is outdated and requires re-training.

In some embodiments, a trained quality monitor determines the values of one or more targeted measurement quality indicators based on a measurement data set and corresponding simulated measurement signals. More specifically, the trained quality monitor classifies the quality of the measurement based on features extracted from one or more indications of a comparison between the measured and simulated data. The indicators of the comparison between the measured and simulated data are quantitative results of any suitable analyses employed to extract differences or similarities between the measured and simulated data, e.g., pixel by pixel differences, relative differences, correlation, etc.

In some embodiments, a trained quality monitor determines one or more parameters of interest based on differences between measured and simulated data. In addition, the one or more parameters of interest are compared with a reference value of the one or more parameters of interest to determine the state of each corresponding targeted measurement quality indicator.

In some embodiments, a trained quality monitor module determines the values of one or more targeted measurement quality indicators based on differences between values of one or more parameters of interest separately determined based on the measurement data set and the simulated measurement data set.

In some embodiments, a trained quality monitor determines the values of one or more targeted measurement quality indicators based on differences between values of one or more parameters of interest separately determined based on the measurement data set by a trained monitor model and a trained measurement model.

In some embodiments, a trained quality monitor determines the values of one or more targeted measurement quality indicators based on the measurement data set. More specifically, the trained quality monitor classifies the quality of the measurement based on features extracted from the measured data. In one example, if an initial release of a measurement application is deemed healthy, the similarity of measurement signals over time is analyzed to determine if an unhealthy shift has occurred.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
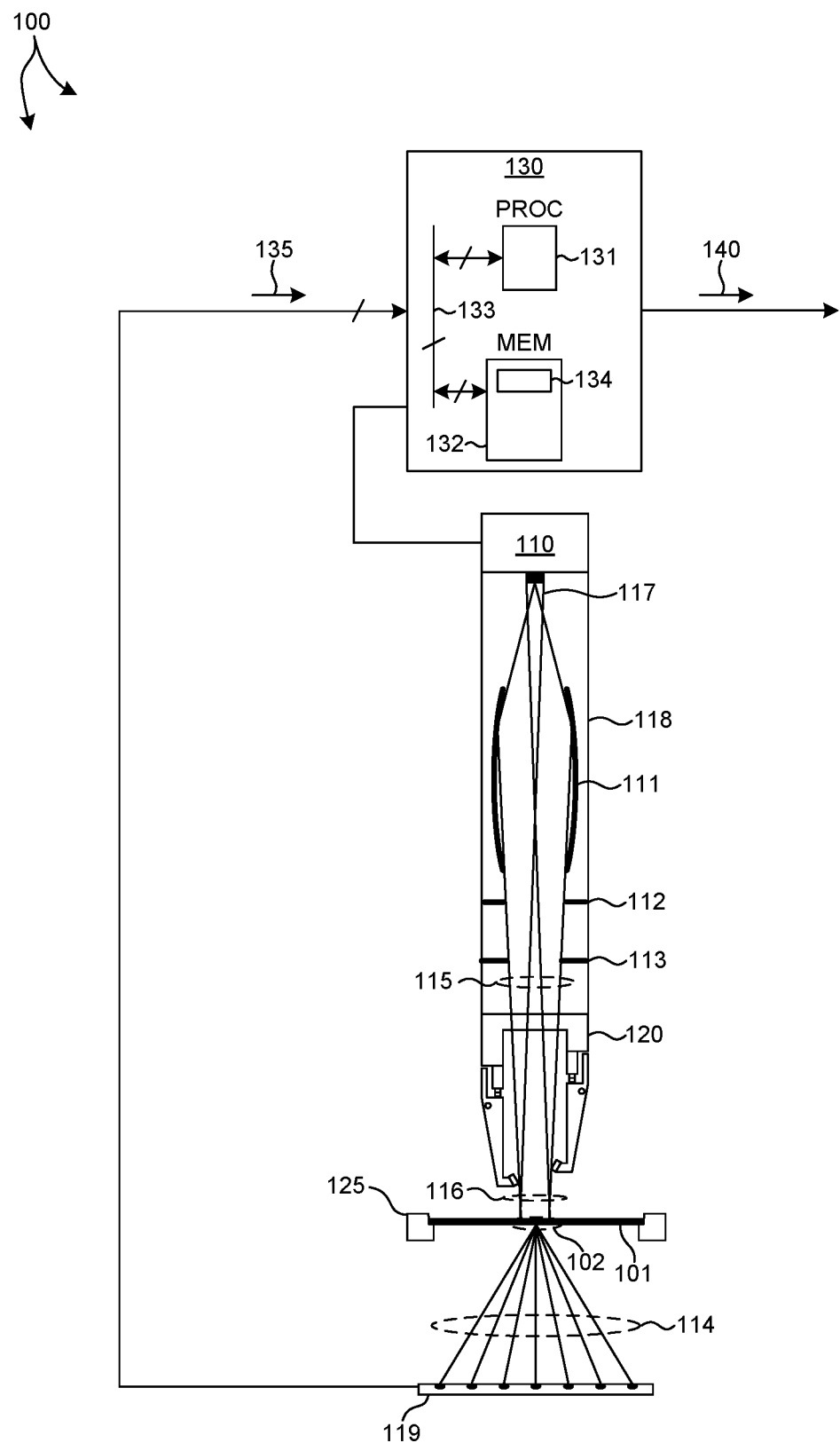
FIG. 1 depicts an illustration of a semiconductor measurement system 100 for monitoring the measurement quality of measurements performed on a wafer in one embodiment in accordance with the exemplary methods presented herein.

Reference will now be made in detail to background examples and some embodiments of the invention, examples of which are illustrated in the accompanying drawings.

Methods and systems for monitoring the quality of a semiconductor measurement in a targeted manner are presented herein. Rather than relying on one or more general indices to determine overall measurement quality, one or more targeted measurement quality indicators are determined. Each targeted measurement quality indicator provides insight into whether a specific operational issue is adversely affecting measurement quality. In this manner, the one or more targeted measurement quality indicators not only highlight deficient measurements, but also provide insight into specific operational issues contributing to measurement deficiency.

In general, the quality of a semiconductor measurement depends on the health of several operational elements. By way of non-limiting example, operational elements include the metrology system, the measurement model, and the underlying fabrication process. Each of these elements has the potential to drift, slowly or quickly, causing a degradation of measurement quality. In some embodiments, a metrology system includes a number of targeted measurement quality indicators, each focused on a different operational element. In this manner, the source of overall measurement degradation, e.g., an overall increase in measurement uncertainty, can be narrowed to one or more specific operational elements of the metrology system.

A targeted measurement quality indicator may be specifically employed to characterize the uncertainty associated with a measured parameter of interest, defect classification, etc. However, in general, a targeted measurement quality indicator may be employed for a variety of other purposes. In some examples, a targeted measurement quality indicator is employed as a filter to detect measurement outliers. In one example, the value of a targeted measurement quality indicator associated with a particular measurement is compared to a predetermined threshold value. If the targeted measurement quality indicator value exceeds the predetermined threshold value, the measurement is considered an outlier. In some examples, a targeted measurement quality indicator is employed as a trigger to adjust a semiconductor process. For example, if the average value of a number of targeted measurement quality indicator each associated with a different instance of the same measurement exceeds a predetermined threshold value, the process is adjusted to bring the average value of the targeted measurement quality indicator back into a desired range.

Similarly, in some examples, targeted measurement quality indicator values are employed to detect wafers that are not within manufacturing specifications. In some of these examples, targeted measurement quality indicator values are employed to detect when a measurement tool bias has drifted out of specification. In other examples, targeted measurement quality indicator values are employed to detect when a measurement error bias has drifted out of specification.

In some embodiments, a value of a targeted measurement quality indicator is determined for each measurement sample during measurement inference. In some of these embodiments, a semiconductor measurement involves inferring values of one or more parameters of interest from measurement data using a trained measurement model. In some of these embodiments, the trained measurement model is physics-based. In some other embodiments, the trained measurement model is a machine learning based measurement model (e.g., linear model, neural network model, convolutional network model, etc.). If the estimated value of the targeted measurement quality indicator indicates that measurement quality is insufficient, the measurement is flagged. In some examples, repeated instances of insufficient measurement quality indicate that the measurement model is outdated and requires re-training.

In some embodiments, the trained measurement model is a defect classification model trained to detect and classify defects from measurement data. In these embodiments, a trained quality monitor model is employed to determine the quality of the defect classification. In some of these embodiments, the measurement data is image data, and the trained quality monitor model is employed to determine the quality of the defect detection from the image data.

In some embodiments, the trained measurement model is a metrology model trained to estimate values of geometric parameters of interest (e.g., critical dimensions, overlay, etc.), dispersion parameters of interest (e.g., index of refraction, etc.), process parameters of interest (e.g., lithographic focus, dosage, etc.), electrical properties of interest (e.g., bandgap, etc.), or any combination thereof. In these embodiments, a trained quality monitor model is employed to determine the quality of the estimated parameters of interest.

In general, a trained quality monitor model is any of a machine learning based model, a physics based model, and heuristic, rule-based model.

In one aspect, a measurement system includes a trained quality monitor model to determine values of one or more targeted measurement quality indicators each indicative of measurement quality associated with a different operational element of the measurement system. The targeted measurement quality indicator values are determined based on measurement data collected from inline wafers at each measurement site without using reference metrology.

FIG. 1 illustrates a system 100 for measuring characteristics of a specimen and determining values of one or more targeted measurement quality indicators associated with each measurement in accordance with the exemplary methods presented herein.

FIG. 1 illustrates an embodiment of a Transmission, Small Angle X-ray Scatterometry (T-SAXS) metrology tool 100 for measuring characteristics of a specimen in at least one novel aspect. As shown in FIG. 1, the system 100 may be used to perform T-SAXS measurements over an inspection area 102 of a specimen 101 illuminated by an illumination beam spot.

In the depicted embodiment, metrology tool 100 includes an x-ray illumination source 110 configured to generate x-ray radiation suitable for T-SAXS measurements. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size 102 on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. In some embodiments, an additional intermediate slit 113 is located in the beam path between beam divergence control slit 112 and beam shaping slit mechanism 120. Intermediate slit 113 provides additional beam shaping. Beam shaping slit mechanism 120 is located in the beam path immediately before specimen 101. The slits of beam shaping slit mechanism 120 are located in close proximity to specimen 101 to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101. In other examples, beam divergence is controlled by beam shaping slits located less than 100 millimeters from specimen 101.

In some embodiments, beam shaping slit mechanism 120 includes multiple, independently actuated beam shaping slits. In one embodiment, beam shaping slit mechanism 120 includes four independently actuated beam shaping slits. These four beams shaping slits effectively block a portion of incoming beam 115 and generate an illumination beam 116 having a box shaped illumination cross-section.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

X-ray detector 119 collects x-ray radiation 114 scattered from specimen 101 and generates output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 125 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In some embodiments, a T-SAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on T-SAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In one aspect, computing system 130 is configured as a measurement quality engine configured to determine the values of one or more targeted measurement quality indicators based on an amount of measurement data collected by a measurement system, e.g., metrology system 100. Each targeted measurement quality indicator is indicative of measurement quality associated with a different operational element of the measurement system.

The measurement data includes actual measurement data, simulated measurement data, or both. In some embodiments, measurement data includes simulated measurement data from the simulation of a measurement of one or more measurement targets that are structurally different from measurement targets employed as part of a training data set.

In some embodiments, measurement data includes actual measurement data from the measurement of particular targets by a particular measurement tool. Typically, the measurement data includes actual measurements of targets on nominal wafers. In some embodiments, measurement data is collected from multiple wafers. In some embodiments, measurement data is collected from Design Of Experiments (DOE) wafers. In some embodiments, measurement data is collected by multiple measurement systems.

In some embodiments, features of the measurement data set are directly employed as input data to a trained quality monitor model. However, in some other embodiments, the measurement data set is transformed to a reduced dimension and the features of the reduced measurement data set are directly employed as input data to the trained quality monitor model. In many practical situations it is preferred to reduce the dimension of the measurement data set to reduce the computational burden. In general, the same data feature dimension reduction technique employed to reduce a training data set is also employed to reduce the measurement data set.

In some embodiments, data feature dimension reduction is achieved by principle component analysis, where the measured data set is resolved into a much smaller set of principle components. In general, any suitable data reduction technique may be employed, e.g., Fourier analysis, wavelet analysis, discrete cosine transform analysis, etc.

Figure 2:
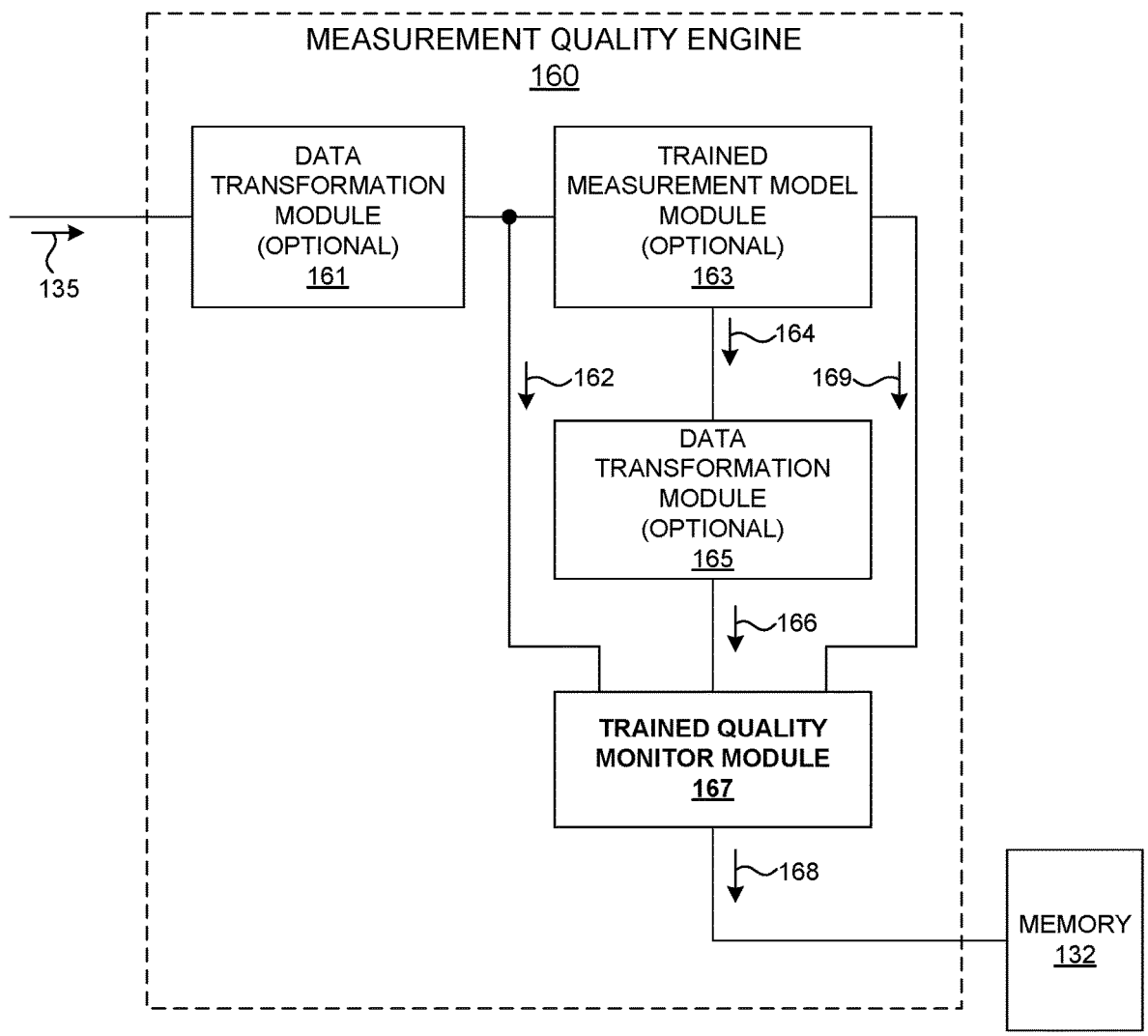
FIG. 2 is a diagram illustrative of an exemplary measurement quality engine 160 in one embodiment.

FIG. 2 depicts an illustration of a measurement quality engine 160 in one embodiment. As depicted in FIG. 2, measurement quality engine 160 includes an optional data transformation module 161, an optional trained measurement model module 163, and optional data transformation module 165, and a trained quality monitor module 167.

As depicted in FIG. 2, measurement data set 135 is received by data transformation module 161. In one example, data transformation module 161 transforms the features of the measurement data set 135 to a set of principal components communicated to trained measurement model module 163 and trained quality monitor module 167.

The trained measurement model module 163 determines values of one or more parameters of interest 169 based on the set of principle components 162 using the trained measurement model. The calculated values of the parameters of interest 169 are communicated to the trained quality monitor module 167. Exemplary parameters of interest include geometric parameters, dispersion parameters, process parameters or electrical parameters characterizing the measured structure.

In addition, trained measurement model module 163 generates a set of simulated measurement signals 164 corresponding to the values of the one or more parameters of interest 169. The trained measurement model module 163 reconstructs each feature of the measurement data set (or reduced measurement data set) based on the values of the one or more parameters of interest estimated by the trained measurement model based on the measurement data set (or reduced measurement data set).

As depicted in FIG. 2, the simulated measurement signals 164 are received by data transformation module 165. In one example, data transformation module 165 transforms the features of the measurement data set 164 to a set of principal components 166 communicated to trained quality monitor module 167. The trained quality monitor module 167 determines the values of one or more targeted measurement quality indicators 168 based on the measurement data set 135 (or the reduced measurement data set 162), and optionally, the simulated measurement signals 164 (or the reduced measurement signals 166), the values of the one or more parameters of interest 169, or both. The values of one or more targeted measurement quality indicators 168 are stored in a memory, e.g., memory 132.

In some embodiments, a trained quality monitor module 167 determines the values of one or more targeted measurement quality indicators 168 based on the measurement data set 135 (or the reduced measurement data set 162) and the simulated measurement signals 164 (or the reduced measurement signals 166). More specifically, the trained quality monitor classifies the quality of the measurement based on features extracted from one or more indications of a comparison between the measured and simulated data. The indicators of a comparison between the measured and simulated data are quantitative results of any suitable analyses employed to extract differences or similarities between the measured and simulated data, e.g., pixel by pixel differences, relative differences, correlation, etc.

Figure 3:
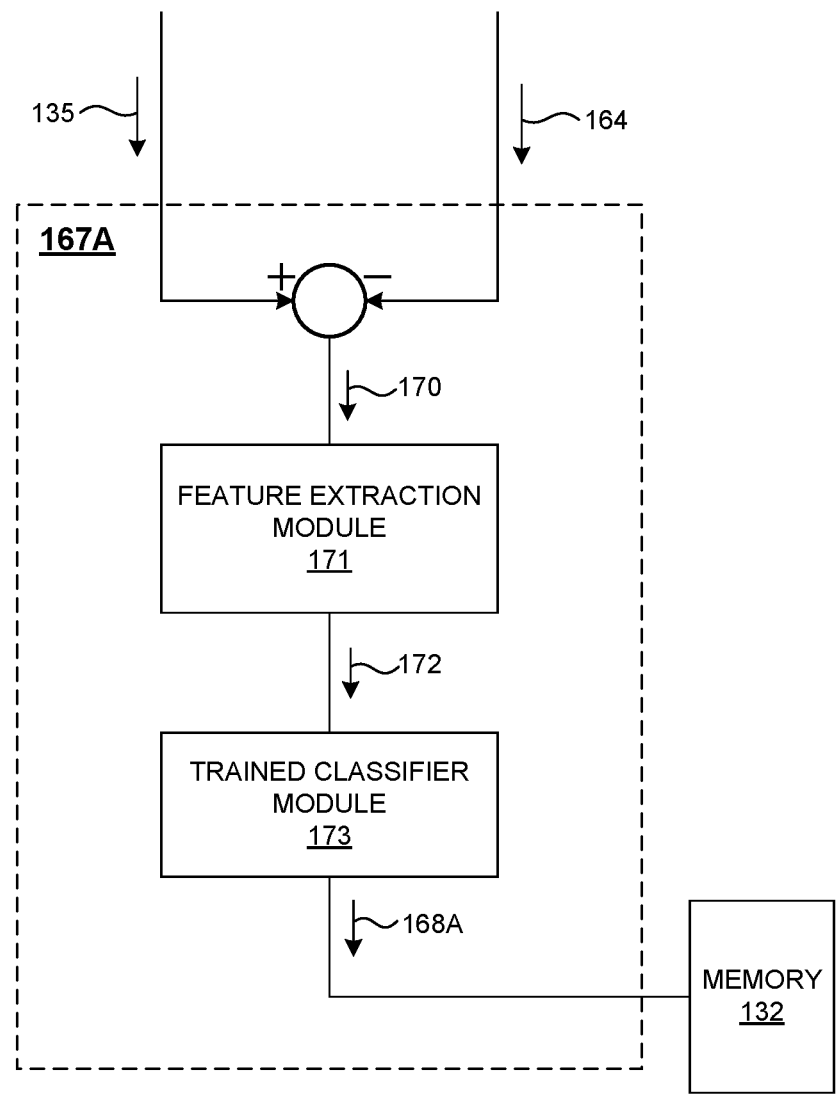
FIG. 3 is a diagram illustrative of an exemplary trained quality monitor module 167A in one embodiment.

FIG. 3 depicts an illustration of a trained quality monitor module 167A in one embodiment. The trained quality monitor module 167A includes a feature extraction module 171 and a trained classifier module 173. As depicted in FIG. 3, trained quality monitor module 167A receives measurement data 135 and simulated measurement data 164, and determines a difference between the two data sets. The difference data set 170 is communicated to feature extraction module 171. Feature extraction module 171 generates a set of features 172 from the difference data set 170.

Feature extraction module 171 is trained to extract any number of different features that describe the quality of a match between measured and simulated data. In some examples the measured data 135 is one or more measured scatterometry images captured by detector 119 depicted in FIG. 1, and simulated data 164 are corresponding scatterometry images simulated by the trained measurement model of module 163. Exemplary features of the difference images 170 include image symmetry, correlation, higher order moments, etc.

In general, the exact mix of features employed to characterize the quality of the match between measured and simulated images varies by measurement application. To overcome this limitation, feature extraction module 171 extracts a pre-determined set of features known to be valuable in assessing measurement health. By way of non-limiting example, the pre-determined set of features includes any of correlation, residual, skew, etc. In addition, feature extraction module 171 determines additional features derived from the variance of the difference data using one or more feature extraction routines, e.g., principle component analysis (PCA), one or more auto-encoders, etc. In this manner, feature extraction module 171 generates a set of features 172 that characterize the quality of the match between measured and simulated images over a broad range of measurement application.

In addition, the trained classifier model of module 173 is trained with measurement data sets known to be healthy and unhealthy. The measurement data sets may be actual measurements or may be generated synthetically, i.e., by simulation. In this manner, the trained classifier model is trained to distinguish healthy measurements from unhealthy measurements based on the set of features 172. Each of the features may represent one or more measurement issues or process values, and classifier 173 determines whether these issues or process values result in a healthy or unhealthy measurement.

As depicted in FIG. 3, trained classifier module 173 determines a classification of each measurement as healthy or unhealthy based on the set of features 172. The targeted measurement quality indicator 168A generated by the trained classifier module 173 is a signal indicative of whether the measurement is considered healthy or unhealthy. The results are stored in a memory (e.g., memory 132).

In some examples, trained quality monitor module 167A operates as a gate on in-line measurements of production wafers. In one example, a subsequent inspection of a particular wafer is only trusted if the targeted measurement quality indicator 168A indicates a healthy measurement. If the targeted measurement quality indicator 168A indicates an unhealthy measurement, the subsequent inspection is deemed to be not trustworthy. Moreover, if the targeted measurement quality indicator 168A indicates an unhealthy measurement, an alternative metrology technique may be employed to measure the wafer. In another example, if the targeted measurement quality indicator 168A indicates an unhealthy measurement, the measured die is considered a failure, rather than a success. In this manner, the trained quality monitor module 167A operates to determine device yield. In these examples, yield is typically included as part of the training criteria.

In some embodiments, a trained quality monitor module 167 determines the values of one or more targeted measurement quality indicators 168 based on the measurement data set 135 (or the reduced measurement data set 162) and the simulated measurement signals 164 (or the reduced measurement signals 166). More specifically, the trained quality monitor determines one or more parameters of interest based on differences between measured and simulated data. In addition, the one or more parameters of interest are compared with a reference value of the one or more parameters of interest to determine the state of each corresponding targeted measurement quality indicator.

Figure 4:
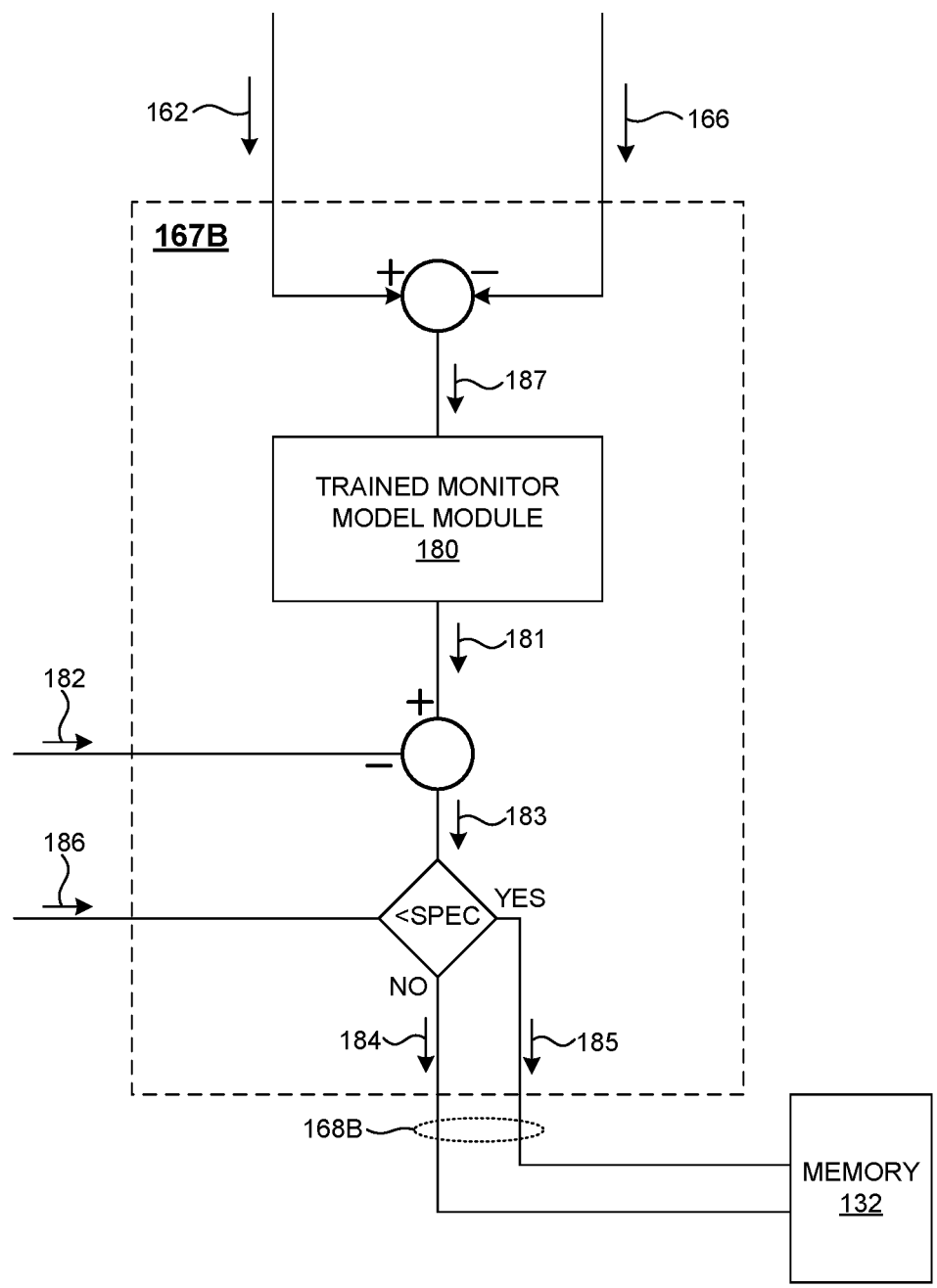
FIG. 4 is a diagram illustrative of an exemplary trained quality monitor module 167B in one embodiment.

FIG. 4 depicts an illustration of a trained quality monitor module 167B in one embodiment. The trained quality monitor module 167B includes a trained monitor model module 180. In the embodiment depicted in FIG. 4, trained quality monitor module 167B receives reduced measurement data 162 and reduced simulated measurement data 166, and determines a difference between the two data sets. The difference data set 187 is communicated to trained monitor model module 180. The trained monitor model of module 180 generates an estimated value 181 of one or more parameters of interest characterizing the structures under measurement from the difference data set 187.

The trained monitor model is trained to estimate one or more parameters of interest characterizing the structures under measurement from differences between measured signals (or reduced measured signals) and corresponding measurement response signals generated by a trained measurement model employed to estimate values of one or more parameters of interest characterizing the same structures under measurement.

In some embodiments, the trained monitor model is physics-based. In some other embodiments, the trained monitor model is a machine learning based model (e.g., linear model, neural network model, convolutional network model, etc.). The monitor model is trained based on measurements of DOE wafers having known values of the one or more parameters of interest. In some embodiments, the known values of the parameters of interest may be measured by a trusted, reference metrology system. In other embodiments, the known values of the parameters of interest are programmed values of the parameters of interest. In these embodiments, the measurement data employed to train the monitor model is generated synthetically, i.e., simulation.

As depicted in FIG. 4, the trained quality monitor module 167B receives a reference value 182 of the one or more parameters of interest corresponding to the estimated values 181. The difference values 183 between the estimated values 181 and the reference values 182 are compared with a specification value 186. If the specification is exceeded, a signal 184 is communicated from the trained monitor module 167B indicating that the measurement quality associated with a particular parameter of interest is not trustworthy. If the difference value 183 associated with a particular parameter of interest is within the specification 186, a signal 185 is communicated from the trained monitor module 167B indicating that the measurement quality associated with the particular parameter of interest is trustworthy. In this manner, the targeted measurement quality indicator 168B generated by the trained quality monitor module 167B is one of two signals indicative of whether the measurement of each parameter of interest is considered healthy or unhealthy. The results are stored in a memory (e.g., memory 132).

In some embodiments, a trained quality monitor module 167 determines the values of one or more targeted measurement quality indicators 168 based on differences between values of one or more parameters of interest separately determined based on the measurement data set 135 (or the reduced measurement data set 162) and the simulated measurement signals 164 (or the reduced measurement signals 166).

Figure 5:
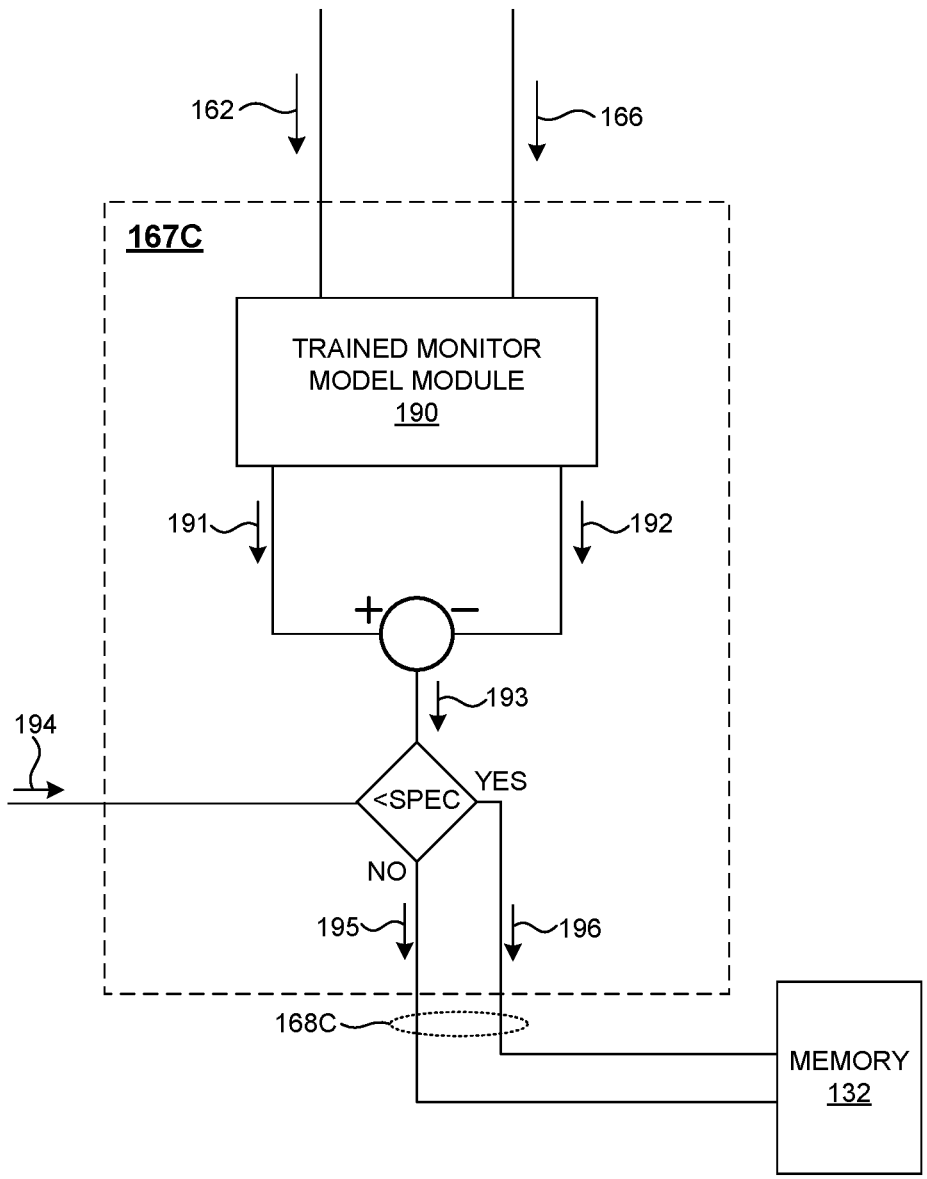
FIG. 5 is a diagram illustrative of an exemplary trained quality monitor module 167C in one embodiment.

FIG. 5 depicts an illustration of a trained quality monitor module 167C in one embodiment. The trained quality monitor module 167C includes a trained monitor model module 190. In the embodiment depicted in FIG. 5, the trained monitor model of module 190 estimates values 191 of one or more parameters of interest based on the reduced measurement data set 162. In addition, the trained monitor model of module 190 estimates values 192 of the same one or more parameters of interest based on the reduced simulated data set 166. The trained quality monitor module 167C determines a difference 193 between the estimated values 191 and 192 associated with each parameter of interest.

As depicted in FIG. 5, each of the difference values 193 are compared with a specification value 194. If the difference value 193 associated with a particular parameter of interest exceeds the specification 194, a signal 195 is communicated from the trained monitor module 167C indicating that the measurement quality associated with a particular parameter of interest is not trustworthy. If the difference value 193 associated with a particular parameter of interest is within the specification 194, a signal 196 is communicated from the trained monitor module 167C indicating that the measurement quality associated with the particular parameter of interest is trustworthy. In this manner, the targeted measurement quality indicator 168C generated by the trained quality monitor module 167C is one of two signals indicative of whether the measurement of each parameter of interest is considered healthy or unhealthy. The results are stored in a memory (e.g., memory 132).

The trained monitor model is trained to estimate one or more parameters of interest characterizing the structures under measurement from both measured signals (or reduced measured signals) and corresponding measurement response signals generated by a trained measurement model employed to estimate values of one or more parameters of interest characterizing the same structures under measurement.

In some embodiments, the trained monitor model is physics-based. In some other embodiments, the trained monitor model is a machine learning based model (e.g., linear model, neural network model, convolutional network model, etc.). The monitor model is trained based on measurements of DOE wafers having known values of the one or more parameters of interest. In some embodiments, the known values of the parameters of interest may be measured by a trusted, reference metrology system. In other embodiments, the known values of the parameters of interest are programmed values of the parameters of interest. In these embodiments, the measurement data employed to train the monitor model is generated synthetically, i.e., simulation.

As illustrated in FIG. 5, the trained monitor model estimates a value of a parameter of interest from measurement signals and another value of the same parameter of interest from the corresponding measurement response signals generated by the trained measurement model. This allows a projection into the possible errors in the trained measurement model. When the trained measurement model is performing well, the values predicted by the trained monitor model based on the two different data sets are close. When the values predicted by the trained monitor model based on the two different data sets are disparate, this indicates the prediction associated with a particular parameter of interest by the trained measurement model is in error.

In one example, the trained monitor model is a machine learning based model trained to predict values for system parameters, critical dimension (CD) parameters, and tilt parameters. The model is sensitive to all of these parameters because these parameters each have specifically different measurement responses. Conversely, the model is not sensitive to general noise or systematic errors that affect all image pixels similarly.

By training the monitor model on different parameters of interest, it is possible to determine an indication of measurement quality associated with many different operational elements of the overall measurement. For example, if one or more system parameters are deviating from specification, this indicates that the metrology tool itself should be checked and serviced.

In another example, the targeted measurement quality indicator 168C is determined for a known, reference wafer, e.g., a monitor wafer. In this example, only the system can be at fault.

In other examples, a user may select which targeted measurement quality indicator 168C to consider or ignore based on the measurement application. For example, if a particular measurement recipe is designed to estimate tilt of a structure, then targeted measurement quality indicators associated with CD are ignored, while targeted measurement quality indicators associated with tilt are considered. If targeted measurement quality indicators associated with tilt are within specification, the measurement recipe is accepted, even though overall measurement uncertainty would indicate the measurement recipe should be discarded.

In some embodiments, a trained quality monitor module 167 determines the values of one or more targeted measurement quality indicators 168 based on differences between values of one or more parameters of interest separately determined based on the measurement data set 135 (or the reduced measurement data set 162) by a trained monitor model and a trained measurement model.

Figure 6:
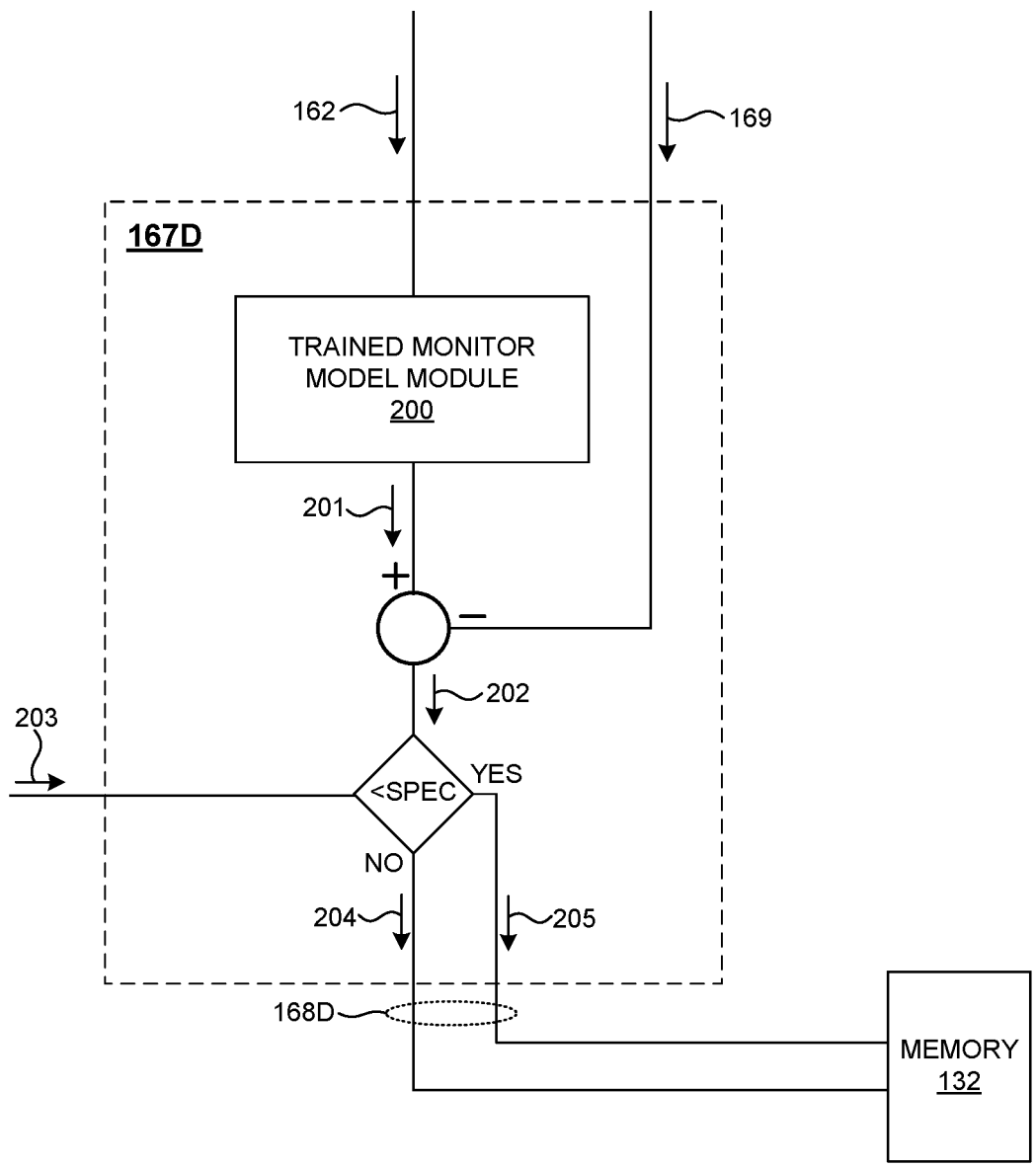
FIG. 6 is a diagram illustrative of an exemplary trained quality monitor module 167D in one embodiment.

FIG. 6 depicts an illustration of a trained quality monitor module 167D in one embodiment. The trained quality monitor module 167D includes a trained monitor model module 200. In the embodiment depicted in FIG. 6, the trained monitor model of module 200 estimates values 201 of one or more parameters of interest based on the reduced measurement data set 162 (or measurement data set 135). In addition, the trained quality monitor module 167D receives values 169 of the same one or more parameters of interest estimated by the trained measurement model as depicted in FIG. 2. The trained measurement model estimates the values 169 of the same one or more parameters of interest based on the same reduced measurement data set 162 (or measurement data set 135). The trained quality monitor module 167D determines a difference 202 between the estimated values 201 and 169 associated with each parameter of interest.

As depicted in FIG. 6, each of the difference values 202 are compared with a specification value 203. If the difference value 202 associated with a particular parameter of interest exceeds the specification 203, a signal 204 is communicated from the trained monitor module 167D indicating that the measurement quality associated with a particular parameter of interest is not trustworthy. If the difference value 202 associated with a particular parameter of interest is within the specification 203, a signal 205 is communicated from the trained monitor module 167D indicating that the measurement quality associated with the particular parameter of interest is trustworthy. In this manner, the targeted measurement quality indicator 168D generated by the trained quality monitor module 167D is one of two signals indicative of whether the measurement of each parameter of interest is considered healthy or unhealthy. The results are stored in a memory (e.g., memory 132).

The trained monitor model is trained to estimate one or more parameters of interest characterizing the structures under measurement from measured signals (or reduced measured signals). In some embodiments, the monitor model is trained based on measurements of DOE wafers having known values of the one or more parameters of interest. In some embodiments, the known values of the parameters of interest may be measured by a trusted, reference metrology system. In other embodiments, the known values of the parameters of interest are programmed values of the parameters of interest. In these embodiments, the measurement data employed to train the monitor model is generated synthetically, i.e., simulation.

In some embodiments, the trained monitor model is physics-based. In some other embodiments, the trained monitor model is a machine learning based model (e.g., linear model, neural network model, convolutional network model, etc.).

In some embodiments, a trained quality monitor module 167 determines the values of one or more targeted measurement quality indicators 168 based on the measurement data set 135 (or the reduced measurement data set 162). More specifically, the trained quality monitor classifies the quality of the measurement based on features extracted from the measured data. If an initial release of a measurement application is deemed healthy, the quality of subsequent measurement signals may be used as an indication of measurement health. In some embodiments, the similarity of measurement signals over time is analyzed to determine if an unhealthy shift has occurred.

Figure 7:
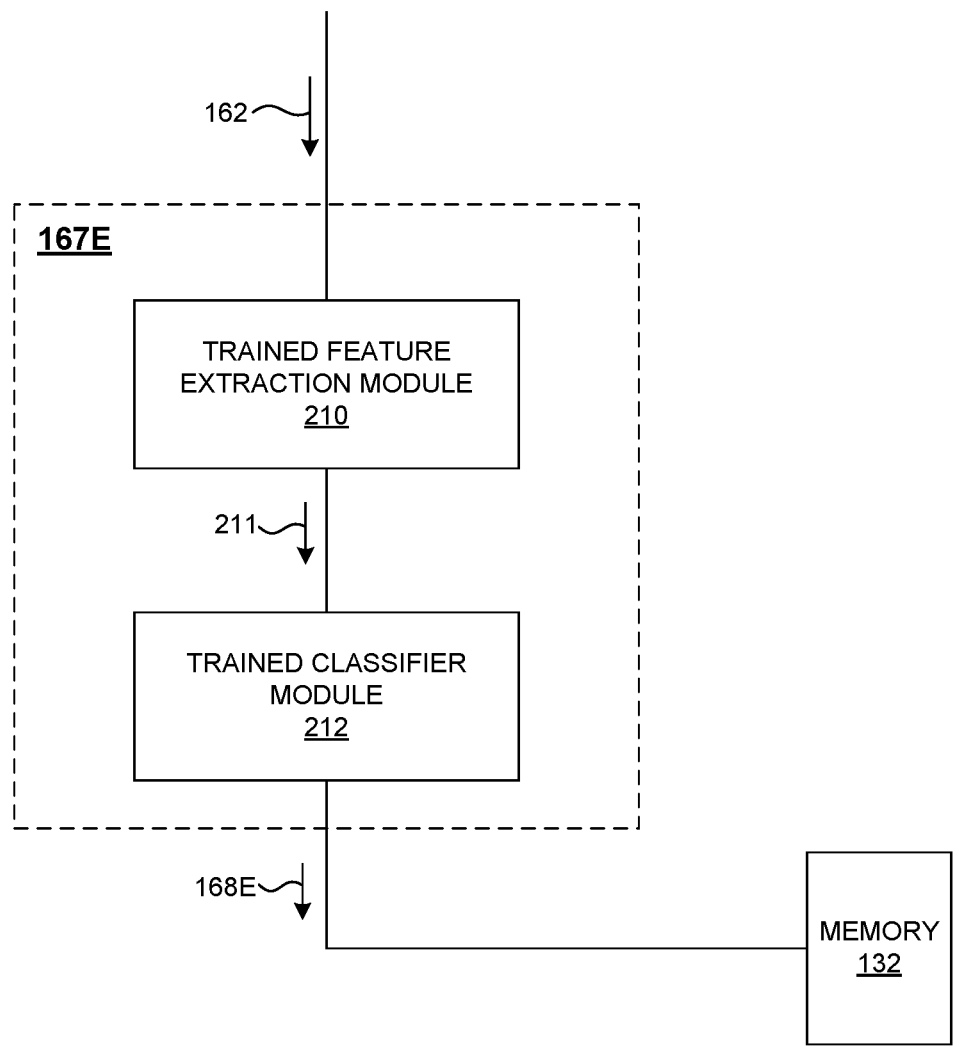
FIG. 7 is a diagram illustrative of an exemplary trained quality monitor module 167E in one embodiment.

FIG. 7 depicts an illustration of a trained quality monitor module 167E in one embodiment. The trained quality monitor module 167E includes a feature extraction module 210 and a trained classifier module 212. As depicted in FIG. 7, trained quality monitor module 167E receives reduced measurement data 162 (or measurement data 135). Trained feature extraction module 210 generates a set of features 211 from the measured data set 162.

Feature extraction module 210 is trained to extract any number of different features that describe the quality of measured data. In some examples the measured data 135 is one or more measured scatterometry images captured by detector 119 depicted in FIG. 1. Exemplary features of the images 135 include image symmetry, correlation, higher order moments, etc.

In general, the exact mix of features employed to characterize the quality of the measured images varies by measurement application. To overcome this limitation, feature extraction module 210 extracts a pre-determined set of features known to be valuable in assessing measurement health. In addition, feature extraction module 210 determines additional features derived from the variance of the measured data using one or more feature extraction routines, e.g., principle component analysis (PCA), one or more auto-encoders, etc. In this manner, feature extraction module 210 generates a set of features 211 that characterize the quality of the measured images over a broad range of measurement applications.

In some embodiments, a trained classifier model of module 212 is trained with training measurement data sets known to be healthy. In these embodiments, the classifier model is trained to identify healthy measurements as subsequent measurements having features that lie within pre-determined bounds of the features of healthy training measurement data sets. The training measurement data sets may be actual measurements or may be generated synthetically, i.e., by simulation.

In some embodiments, a trained classifier model of module 212 is trained with training measurement data sets known to be healthy and training measurement data sets known to be unhealthy. In these embodiments, the classifier model is trained to identify healthy measurements as measurements having features that are similar to corresponding features of healthy training measurement data sets. Similarly, the classifier model is trained to identify unhealthy measurements as measurements having features that are similar to corresponding features of unhealthy training measurement data sets.

As depicted in FIG. 7, trained classifier module 212 determines a classification of each measurement as healthy or unhealthy based on the set of features 211. Each of the features may represent one or more measurement issues or process values, and classifier 212 determines whether these issues or process values result in a healthy or unhealthy measurement. The targeted measurement quality indicator 168E generated by the trained classifier module 212 is a signal indicative of whether the measurement is considered healthy or unhealthy in accordance with each feature. The results are stored in a memory (e.g., memory 132).

In this manner, the determining of the values of one or more targeted quality indicators involves a comparison between one or more features extracted from measurement data and a corresponding set of features extracted from training measurement data measured prior to the measurement data.

The trained classifier module 212 is trained based on healthy measurement data over a range of process DOE, simulations of expected variations, or both. Optionally, specific issues, e.g., tool variances, correlated parameters that are difficult to extract, etc. are employed to generate unhealthy measurement data sets. To separately classify healthy measurement data versus unhealthy measurement data, the feature extraction module 210 is trained to extract features that help separate healthy and unhealthy measurement data sets, whether generated in actuality or synthetically. Trained classifier module 212 employs any suitable measure of similarity to separate healthy measurement data from unhealthy measurement data, e.g., nearest neighbor, average distance, distance from boundary, etc.

In a further aspect, targeted measurement quality indicator values are determined for measurements of production wafers, monitor wafers, or both, on one measurement tool, or across multiple measurement tools to isolate the specific issue(s) contributing to poor measurement health, e.g., system health, measurement model health, tool signature, process health, etc.

In general, the training data and measurement data employed to train and use a quality monitor model as described herein may be collected from any suitable semiconductor measurement system. Suitable systems, by way of non-limiting example, include a spectroscopic ellipsometer, a spectroscopic reflectometer, a soft x-ray based metrology system, a small angle x-ray scatterometry system, an imaging system, a hyperspectral imaging system, etc.

Figure 8:
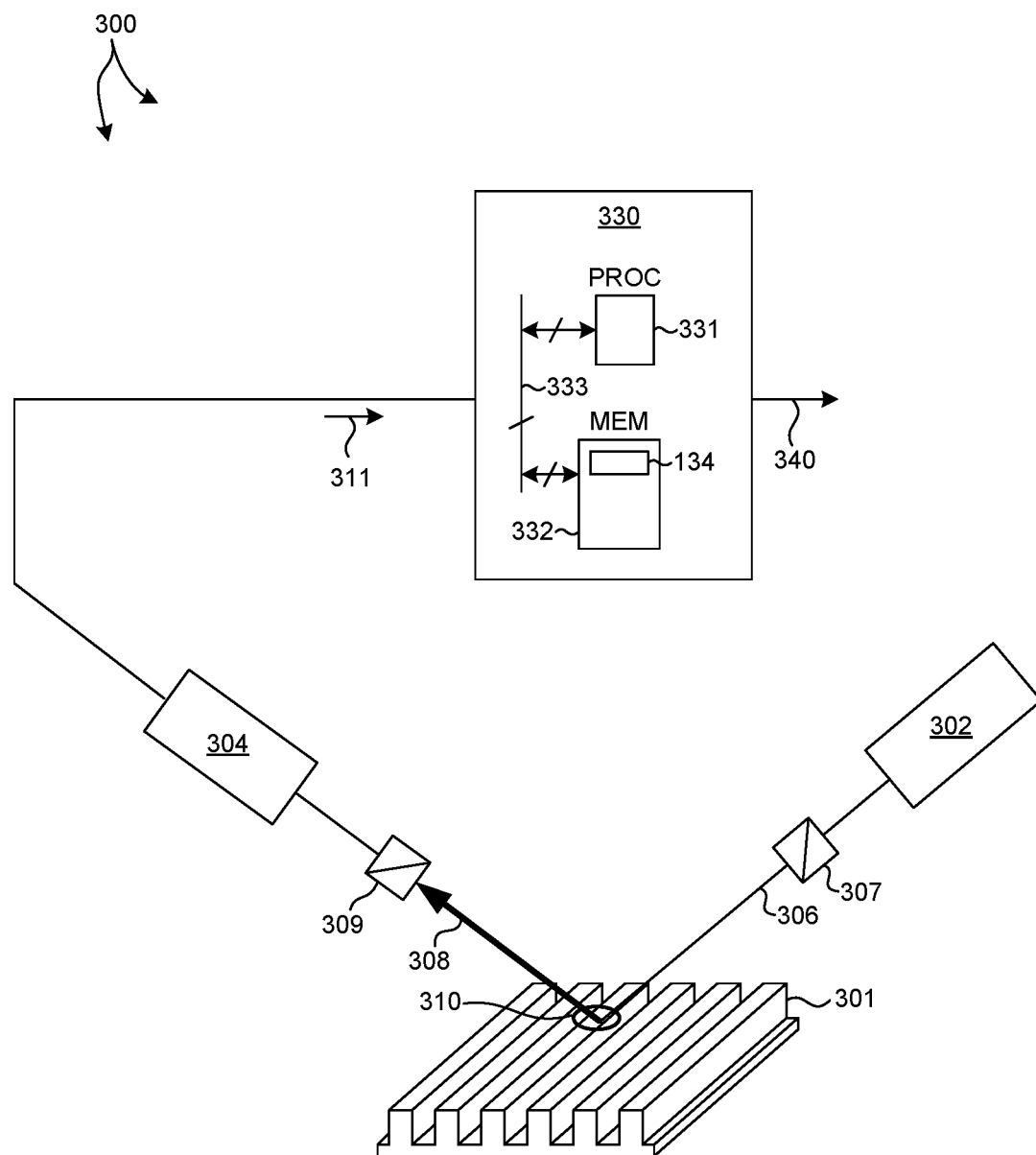
FIG. 8 depicts an illustration of a semiconductor measurement system 300 for monitoring the measurement quality of measurements performed on a wafer in another embodiment in accordance with the exemplary methods presented herein.

By way of non-limiting example, FIG. 8 illustrates a system 300 for measuring characteristics of a specimen and monitoring measurement quality associated with each measurement in accordance with the exemplary methods presented herein. As shown in FIG. 8, the system 300 may be used to perform spectroscopic ellipsometry measurements of structure 301. In this aspect, the system 300 may include a spectroscopic ellipsometer equipped with an illuminator 302 and a spectrometer 304. The illuminator 302 of the system 300 is configured to generate and direct illumination of a selected wavelength range (e.g., 100-2500 nm) to the structure disposed on the surface of the specimen upon which structure 301 is fabricated. In turn, the spectrometer 304 is configured to receive illumination reflected from structure 301. It is further noted that the light emerging from the illuminator 302 is polarized using a polarization state generator 307 to produce a polarized illumination beam 306. The radiation reflected by structure 301 is passed through a polarization state analyzer 309 and to the spectrometer 304. The radiation received by the spectrometer 304 in the collection beam 308 is analyzed with regard to polarization state, allowing for spectral analysis by the spectrometer of radiation passed by the analyzer. These spectra 311 are passed to the computing system 330 for analysis of the structure as described herein.

As depicted in FIG. 8, system 300 includes a single measurement technology (i.e., SE). However, in general, system 300 may include any number of different measurement technologies. By way of non-limiting example, system 300 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof.

In a further embodiment, system 300 may include one or more computing systems 330 employed to perform measurements of structures and determine quality metric values in accordance with the methods described herein. The one or more computing systems 330 may be communicatively coupled to the spectrometer 304. In one aspect, the one or more computing systems 330 are configured to receive measurement data 311 associated with measurements of a structure under measurement (e.g., structure 301).

In one aspect, computing system 330 is configured as a measurement quality engine configured to determine the values of one or more targeted measurement quality indicators each indicative of measurement quality associated with a different operational element of the metrology system as described herein.

In general, training data includes actual measurement data, simulated measurement data, or both. In some embodiments, training data includes simulated measurement data from the simulation of a measurement of particular target by a particular measurement tool. In some embodiments, training data includes actual measurement data from the measurement of particular target by a particular measurement tool. In some of these embodiments, the measurement data includes actual measurements of targets on nominal wafers. In some of these embodiments, the measurement data includes actual measurements of targets on Design Of Experiments (DOE) wafers having known, programmed values of parameters of interest.

Training data may be simulated, collected, or both, for any of a variety of measurement objectives. In some embodiments the measurement objective is measurement accuracy, measurement precision tracking, tool-to-tool matching, wafer-to-wafer variation, etc.

As described hereinbefore, training data is required to train a measurement model. The training data employed to train a quality monitor model may be the same training data set employed to train the corresponding measurement model, a subset of the training data set employed to train the corresponding measurement model, or a data set different from the training data set employed to train the corresponding measurement model. In a preferred embodiment, the training data employed to train the quality monitor model is the same data set or a subset of the data set employed to train the corresponding measurement model.

In some embodiments, reference data is employed to train a quality monitor model. The reference data includes trusted values of the one or more parameters of interest associated with the measurement. In some embodiments, the reference data is obtained from a reference metrology system, i.e., a metrology system trusted to provide a suitable measurement of the parameter of interest. In some embodiments, the reference data is provided by a user of the measurement system based on experience. In some embodiments, the reference data is provided as the known, programmed values of the parameters of interest associated with the measured DOE wafers. In some embodiments, the reference data is derived from a statistical analysis of measurements of the parameters of interest by multiple, different measurement techniques. In some embodiments, the reference data is derived from known physical constraints.

In general, the reference data expresses the values of one or more parameters of interest in various terms such as precision, accuracy (e.g., bias), tracking (e.g., correlation to reference), tool-to-tool matching, within wafer variation, wafer mean, wafer signature, wafer to wafer variations, etc.

In some embodiments, features of the training data set are directly employed as input data to train the quality monitor model. However, in some other embodiments, the training data set is transformed to a reduced dimension and the features of the reduced training data set are directly employed to train the quality monitor model. In many practical situations it is preferred to reduce the dimension of the training data set to reduce the computational burden. In one example, a set of measured spectra employed as training data may include thousands of features (e.g., 15,000 measured signals). However, using data reduction, the dimension of the training data set may be reduced by one or more orders of magnitude (e.g., 200 signals).

In some embodiments, data feature dimension reduction is achieved by principle component analysis, where the measured data set is resolved into a much smaller set of principle components. In general, any suitable data reduction technique may be employed, e.g., Fourier analysis, wavelet analysis, discrete cosine transform analysis, etc.

In some embodiments, the quality monitor model is trained based on specific domain knowledge associated with the training data. Domain knowledge is expressed as one or more probability distributions, which are, in turn, employed to regularize the optimization process employed during training. In this manner, the optimization process is physically regularized by one or more expressions of the physically based probability distributions. By way of non-limiting example, probability distributions associated with measurement precision, tool to tool matching, tracking, within wafer variations, etc. are employed to physically regularize the optimization process. In this manner, domain knowledge acquired from experience, measurement data, and physics is directly expressed in the objective function driving the optimization of the quality monitor model. As a result, domain knowledge is fully exploited in the quality monitor model development process.

In another aspect, the training data and measurement data employed to train and use a quality monitor model as described herein is simulated, collected, or both, from multiple targets located in close proximity on a wafer.

In some embodiments, the measurement targets under measurement as described herein may be actual device structures rather than a dedicated metrology target.

In another aspect, the training data and measurement data employed to train and use a quality monitor model as described herein is collected from one or more targets by multiple, different metrology systems. In one example, measurement data from a first target may be collected by a spectroscopic ellipsometer, measurement data from the same target, or a different target may be collected by a small-angle x-ray scatterometry (SAXS) system, and measurement data from the same target or a different target may be collected by an imaging based metrology system.

In another further aspect, multiple, different parameters of interest are measured and corresponding targeted measurement quality indicators are evaluated for each different parameter of interest. In some embodiments, targeted measurement quality indicators associated with multiple, different parameters of interest are employed to more clearly identify the source of measurement uncertainty associated with a particular measurement recipe, more clearly identify when a change in process parameters is required, or both.

In another further aspect, values of parameters of interest, the corresponding targeted measurement quality indicator values, or both, associated with structures in close proximity to a measurement target are employed to more clearly identify when a change in process parameters is required.

In yet another further aspect, the measurement results described herein can be used to provide active feedback to the process tool (e.g., lithography tool, etch tool, deposition tool, etc.). For example, values of measured parameters determined based on measurement methods described herein can be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values may be communicated to the process tool. In one embodiment, computing system 130 determines values of one or more parameters of interest. In addition, computing system 130 communicates control commands to a process controller based on the determined values of the one or more parameters of interest. The control commands cause the process controller to change the state of the process (e.g., stop the etch process, change the diffusivity, etc.). In one example, a control command causes a process controller to adjust the focus of a lithographic system, a dosage of the lithographic system, or both. In another example, a control command causes a process controller to change the etch rate to improve measured wafer uniformity of a CD parameter.

In some examples, the measurement models are implemented as an element of a SpectraShape® optical critical-dimension metrology system available from KLA-Tencor Corporation, Milpitas, California, USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, California, USA. The resulting, trained model may be incorporated as an element of an AcuShape® library that is accessible by a metrology system performing measurements.

Figure 9:
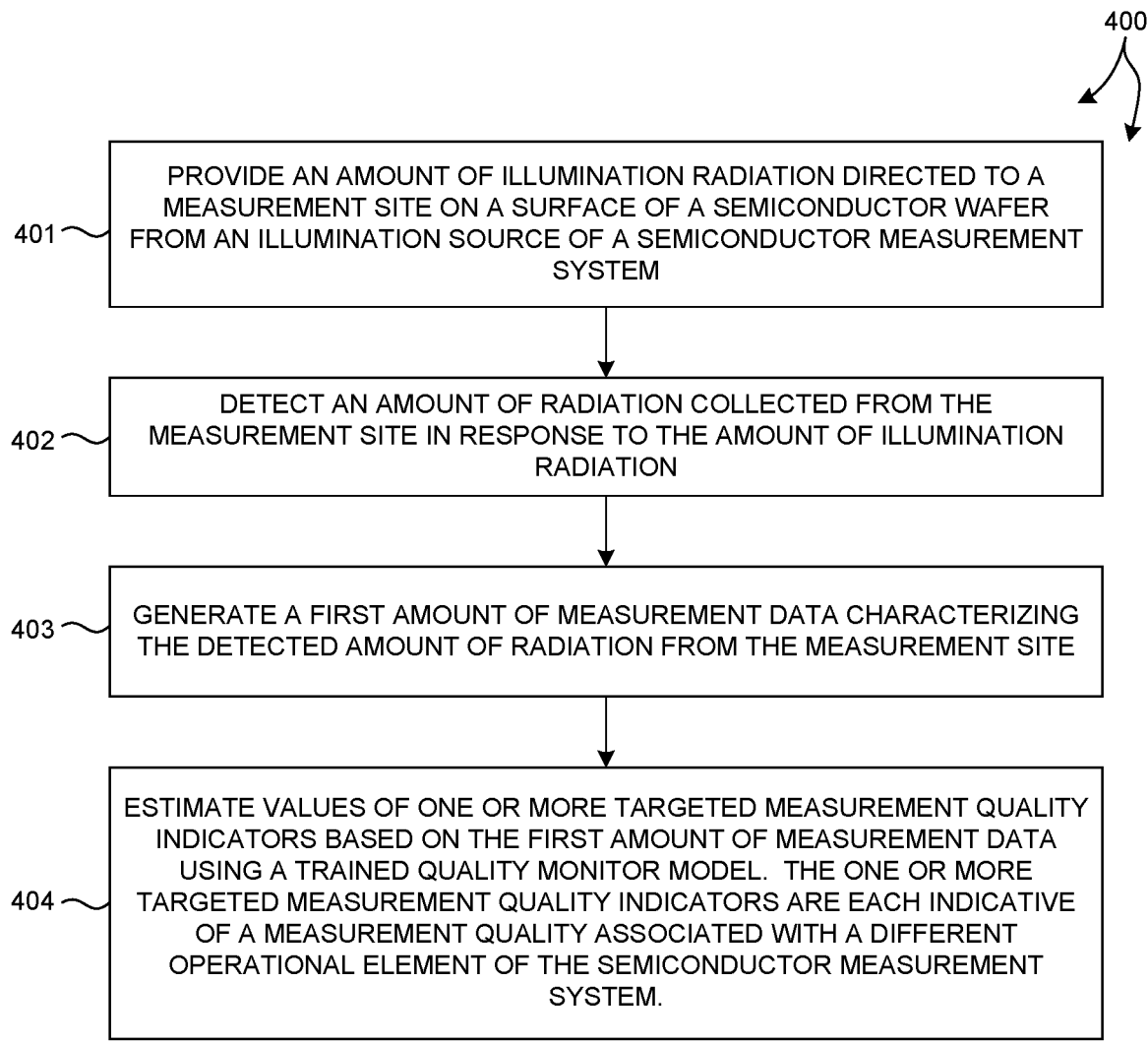
FIG. 9 illustrates a flowchart of a method 400 for estimating values of one or more targeted measurement quality indicators indicative of a measurement quality associated with an operational element of a semiconductor measurement system.

FIG. 9 illustrates a method 300 for estimating a value of a quality metric indicative of one or more performance characteristics of a semiconductor measurement in at least one novel aspect. Method 300 is suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 401, an amount of illumination radiation is directed to a measurement site on a surface of a semiconductor wafer from an illumination source of a semiconductor measurement system.

In block 402, an amount of radiation collected from the measurement site in response to the amount of illumination radiation is detected.

In block 403, a first amount of measurement data characterizing the detected amount of radiation from the measurement site is generated.

In block 404, values of one or more targeted measurement quality indicators are estimated based on the first amount of measurement data using a trained quality monitor model. The one or more targeted measurement quality indicators are each indicative of a measurement quality associated with a different operational element of the semiconductor measurement system.

In a further embodiment, system 100 includes one or more computing systems 130 employed to perform measurements of semiconductor structures based on spectroscopic measurement data collected in accordance with the methods described herein. The one or more computing systems 130 may be communicatively coupled to one or more spectrometers, active optical elements, process controllers, etc. In one aspect, the one or more computing systems 130 are configured to receive measurement data associated with spectral measurements of structures of wafer 104.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
    an illumination source configured to provide an amount of illumination radiation directed to a measurement site on a surface of a semiconductor wafer during a semiconductor measurement;
    a detector configured to detect an amount of radiation collected from the measurement site in response to the amount of illumination radiation; and
    a computing system configured to:
        generate a first amount of measurement data characterizing the detected amount of radiation from the measurement site; and
        determine values of one or more targeted measurement quality indicators based on the first amount of measurement data using a trained quality monitor model, wherein the values of the one or more targeted measurement quality indicators determine if one or more operational elements of the semiconductor measurement are within specification, and wherein the one or more operational elements includes any of a measurement model employed to estimate a value of a parameter of interest characterizing the measurement site from the first amount of measurement data, the system employed to perform the semiconductor measurement, and an underlying fabrication process employed to fabricate structures on the semiconductor wafer at the measurement site.

2. The system of claim 1, the computing system further configured to:
estimate values of one or more parameters of interest characterizing the measurement site from the first amount of measurement data characterizing the detected amount of radiation based on a trained measurement model;
determine a first amount of simulated measurement data from the estimated values of the one or more parameters of interest by the trained measurement model;
determine an indication of a comparison between the first amount of measurement data and the first amount of simulated measurement data; and
extract one or more features from the indication of the comparison between the first amount of measurement data and the first amount of simulated measurement data, wherein the determining of the values of one or more targeted measurement quality indicators is based on the one or more features extracted from the indication of the comparison between the first amount of measurement data and the first amount of simulated measurement data.

3. The system of claim 1, the computing system further configured to:
estimate a value of one or more of a first plurality of parameters of interest characterizing the measurement site from the first amount of measurement data characterizing the detected amount of radiation based on a trained measurement model;
determine a first amount of simulated measurement data from the estimated value of the one or more of the first plurality of parameters of interest by the trained measurement model;
determine a difference between the first amount of measurement data and the first amount of simulated measurement data;
estimate a value of one or more of a second plurality of parameters of interest characterizing the measurement site from the difference between the first amount of measurement data and the first amount of simulated measurement data; and
determine a difference between the value of one or more of the second plurality of parameters of interest and a reference value of each of the one or more of the second plurality of parameters of interest, wherein the determining of the values of one or more targeted measurement quality indicators is based on the difference between the value of one or more of the second plurality of parameters of interest and the reference value of the one or more of the second plurality of parameters of interest.

4. The system of claim 1, the computing system further configured to:
estimate a value of one or more of a first plurality of parameters of interest characterizing the measurement site from the first amount of measurement data characterizing the detected amount of radiation based on a trained measurement model;
determine a first amount of simulated measurement data from the value of the one or more of the first plurality of parameters of interest by the trained measurement model; and estimate a first value of at least one parameter of interest characterizing the measurement site from the first amount of measurement data by a trained monitor model;
estimate a second value of the at least one parameter of interest characterizing the measurement site from the first amount of simulated measurement data by the trained monitor model; and
determine a difference between the first and second values of the at least one parameter of interest, wherein the determining of the values of one or more targeted measurement quality indicators is based on the difference between the first and second values of the at least one parameter of interest.

5. The system of claim 1, the computing system further configured to:
estimate a first value of one or more parameters of interest characterizing the measurement site from the first amount of measurement data characterizing the detected amount of radiation based on a trained measurement model;
estimate a second value of the one or more parameters of interest characterizing the measurement site from the first amount of measurement data based on a trained monitor model; and
determine a difference between the first and second values of the one or more parameters of interest, wherein the determining of the values of one or more targeted measurement quality indicators is based on the difference between the first and second values of the one or more parameters of interest.

6. The system of claim 1, the computing system further configured to:
extract one or more features from the first amount of measurement data, wherein the determining of the values of one or more targeted measurement quality indicators is based on the one or more features extracted from the first amount of measurement data.

7. The system of claim 6, wherein the determining of the values of the one or more targeted quality indicators involves a comparison between the one or more features extracted from the first amount of measurement data and a corresponding set of the one or more features extracted from an amount of measurement data measured prior to the first amount of measurement data.

8. The system of claim 2, wherein the extracting of the one or more features from the indication of the comparison between the first amount of measurement data and the first amount of simulated measurement data involves reducing a dimension of the indication of the comparison.

9. The system of claim 8, wherein the reducing of the dimension of the indication of the comparison involves any of a principal component analysis, a Fourier analysis, a wavelet analysis, and a discrete cosine transform analysis.

10. The system of claim 1, wherein the illumination source and the detector are configured as part of any of a spectroscopic ellipsometer, a spectroscopic reflectometer, a soft x-ray reflectometer, a small angle x-ray scatterometer, an imaging system, and a hyperspectral imaging system.

11. The system of claim 1, wherein an operational element is any of a system parameter, a process parameter, and a parameter characterizing a structure under measurement.

12. A method comprising:
providing an amount of illumination radiation directed to a measurement site on a surface of a semiconductor wafer from an illumination source of a semiconductor measurement system during a semiconductor measurement;

detecting an amount of radiation collected from the measurement site in response to the amount of illumination radiation;

generating a first amount of measurement data characterizing the detected amount of radiation from the measurement site; and estimating values of one or more targeted measurement quality indicators based on the first amount of measurement data using a trained quality monitor model, wherein the values of the one or more targeted measurement quality indicators determine if one or more operational elements of the semiconductor measurement are within specification, and wherein the one or more operational elements includes any of a measurement model employed to estimate a value of a parameter of interest characterizing the measurement site from the first amount of measurement data, the semiconductor measurement system employed to perform the semiconductor measurement, and an underlying fabrication process employed to fabricate structures on the semiconductor wafer at the measurement site.

13. The method of claim 12, further comprising:

estimating values of one or more parameters of interest characterizing the measurement site from the first amount of measurement data characterizing the detected amount of radiation based on a trained measurement model;

determining a first amount of simulated measurement data from the estimated values of the one or more parameters of interest by the trained measurement model;

determining an indication of a comparison between the first amount of measurement data and the first amount of simulated measurement data; and extracting one or more features from the indication of the comparison between the first amount of measurement data and the first amount of simulated measurement data, wherein the determining of the values of one or more targeted measurement quality indicators is based on the one or more features extracted from the indication of the comparison between the first amount of measurement data and the first amount of simulated measurement data.

14. The method of claim 12, further comprising:

estimating a value of one or more of a first plurality of parameters of interest characterizing the measurement site from the first amount of measurement data characterizing the detected amount of radiation based on a trained measurement model;

determining a first amount of simulated measurement data from the estimated value of the one or more of the first plurality of parameters of interest by the trained measurement model;

determining a difference between the first amount of measurement data and the first amount of simulated measurement data;

estimating a value of one or more of a second plurality of parameters of interest characterizing the measurement site from the difference between the first amount of measurement data and the first amount of simulated measurement data; and determining a difference between the value of one or more of the second plurality of parameters of interest and a reference value of each of the one or more of the second plurality of parameters of interest, wherein the determining of the values of one or more targeted measurement quality indicators is based on the difference between the value of one or more of the second plurality of parameters of interest and the reference value of the one or more of the second plurality of parameters of interest.

15. The method of claim 12, further comprising:

estimating a value of one or more of a first plurality of parameters of interest characterizing the measurement site from the first amount of measurement data characterizing the detected amount of radiation based on a trained measurement model;

determining a first amount of simulated measurement data from the value of the one or more of the first plurality of parameters of interest by the trained measurement model;

estimating a first value of at least one parameter of interest characterizing the measurement site from the first amount of measurement data by a trained monitor model;

estimating a second value of the at least one parameter of interest characterizing the measurement site from the first amount of simulated measurement data by the trained monitor model; and determining a difference between the first and second values of the at least one parameter of interest, wherein the determining of the values of one or more targeted measurement quality indicators is based on the difference between the first and second values of the at least one parameter of interest.

16. The method of claim 12, further comprising:

estimating a first value of one or more parameters of interest characterizing the measurement site from the first amount of measurement data characterizing the detected amount of radiation based on a trained measurement model;

estimating a second value of the one or more parameters of interest characterizing the measurement site from the first amount of measurement data based on a trained monitor model; and determining a difference between the first and second values of the one or more parameters of interest, wherein the determining of the values of one or more targeted measurement quality indicators is based on the difference between the first and second values of the one or more parameters of interest.

17. The method of claim 12, further comprising:

extracting one or more features from the first amount of measurement data, wherein the determining of the values of one or more targeted measurement quality indicators is based on the one or more features extracted from the first amount of measurement data.

18. The method of claim 17, wherein the determining of the values of the one or more targeted quality indicators involves a comparison between the one or more features extracted from the first amount of measurement data and a corresponding set of the one or more features extracted from an amount of measurement data measured prior to the first amount of measurement data.

19. A system comprising:

an illumination source configured to provide an amount of illumination radiation directed to a measurement site on a surface of a semiconductor wafer during a semiconductor measurement;

a detector configured to detect an amount of radiation collected from the measurement site in response to the amount of illumination radiation; and a non-transient, computer-readable medium storing instructions that, when executed by one or more processors, causes the one or more processors to:
   generate a first amount of measurement data characterizing the detected amount of radiation from the measurement site; and
   determine values of one or more targeted measurement quality indicators based on the first amount of measurement data using a trained quality monitor model, wherein the values of the one or more targeted measurement quality indicators determine if one or more operational elements of the semiconductor measurement are within specification, and wherein the one or more operational elements includes any of a measurement model employed to estimate a value of a parameter of interest characterizing the measurement site from the first amount of measurement data, the system employed to perform the semiconductor measurement, and an underlying fabrication process employed to fabricate structures on the semiconductor wafer at the measurement site.

\* \* \* \* \*